Nov. 1, 1966 F. P. HEIMAN 3,283,221

FIELD EFFECT TRANSISTOR

Filed Oct. 15, 1962 2 Sheets-Sheet 1

INVENTOR.
FREDERIC P. HEIMAN
BY
W. B. Hill
AGENT

Nov. 1, 1966 F. P. HEIMAN 3,283,221

FIELD EFFECT TRANSISTOR

Filed Oct. 15, 1962 2 Sheets-Sheet 2

INVENTOR.
FREDERIC P. HEIMAN
BY
W. B. Hill
AGENT 3,283,221

FIELD EFFECT TRANSISTOR

Frederic P. Heiman, Highland Park, N.J., assignor to Radio Corporation of America, a corporation of Delaware Filed Oct. 15, 1962, Ser. No. 230,449
3 Claims. (Cl. 317—235)

This invention relates to an improved insulated-gate field-effect transistor.

An insulated-gate field-effect transistor comprises a channel of low resistivity semiconductor material and two spaced electrical contacts to the channel, which are referred to as the source and the drain respectively. An insulated-gate field-effect transistor includes also a gate electrode adjacent and insulated from the channel. When a drain voltage is applied across the source and drain, a drain current flows through the channel. The magnitude of the drain current is a function of the drain voltage and of the number of free charge carriers in the channel. The number of free charge carriers in the channel may be modulated by a gate voltage applied to the gate electrode. This modulation may be a variable reduction in the number of free charge carriers in the channel, resulting in a variable reduction in drain current. Such modulation is referred to as the depletion mode of operation. This modulation may also be a variable increase in the number of free charge carriers in the channel resulting in a variable increase in drain current. Such modulation is referred to as the enhancement mode of operation. In previous devices, the drain current increases as the gate voltage is increased in the one polarity and decreases as the gate voltage is increased in the other polarity, resulting in a single-valued transfer characteristic.

An object of this invention is to provide a novel insulated-gate field-effect transistor.

Another object is to provide an insulated-gate field-effect transistor having a double-valued transfer characteristic; that is, there is an increase in drain current for both positive and negative increases in gate voltage from some value of gate voltage.

The field-effect transistor of the invention comprises a first channel of low resistivity semiconductor material of one conductivity type, a second channel of low resistivity semiconductor material of the other conductivity type upon said first channel, a high resistivity layer upon said second channel, a common gate electrode upon said high resistivity layer, a common source connected to both of said channels, and a common drain connected to both of said channels.

The novel transistor exhibits a novel double-valued transfer characteristic; that is, the drain current increases for both positive and negative increases in gate voltage from some value of gate voltage. The novel transistor operates by controlling the current flow in both channels by an electric field from the common gate electrode. The current flow is principally by electrons in the enhancement mode in one channel and principally by holes in the enhancement mode in the other channel. The total drain current is a composite of the individual drain currents passing through two channels.

Figure 1:
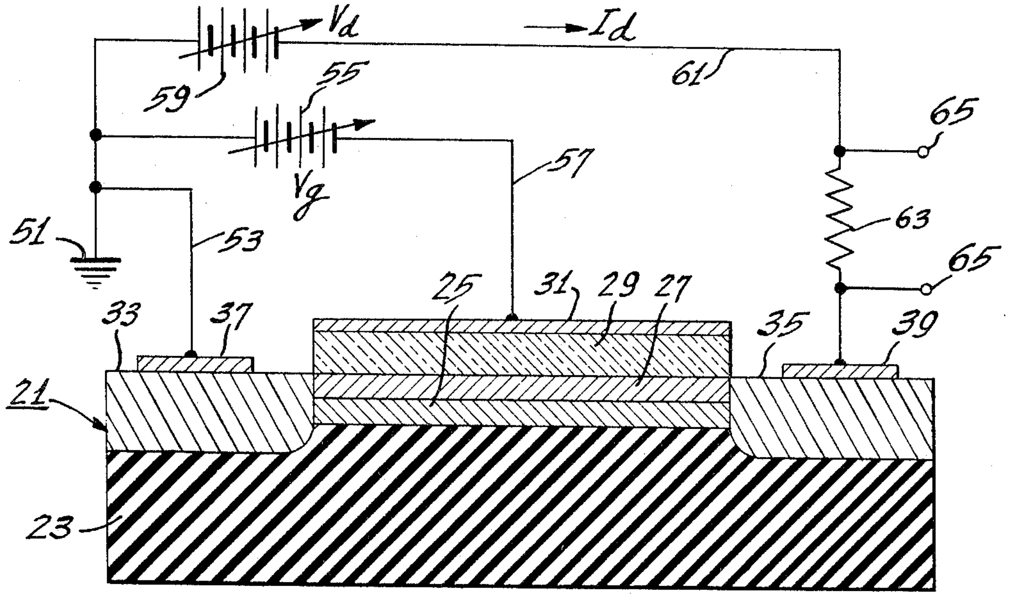
Figure 4:
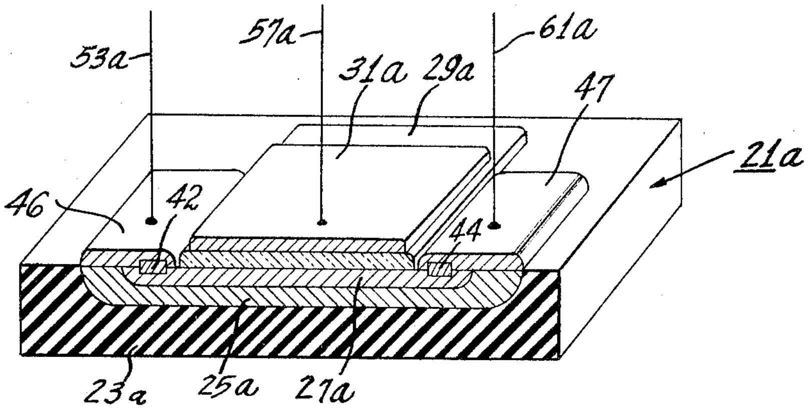
Figure 2:
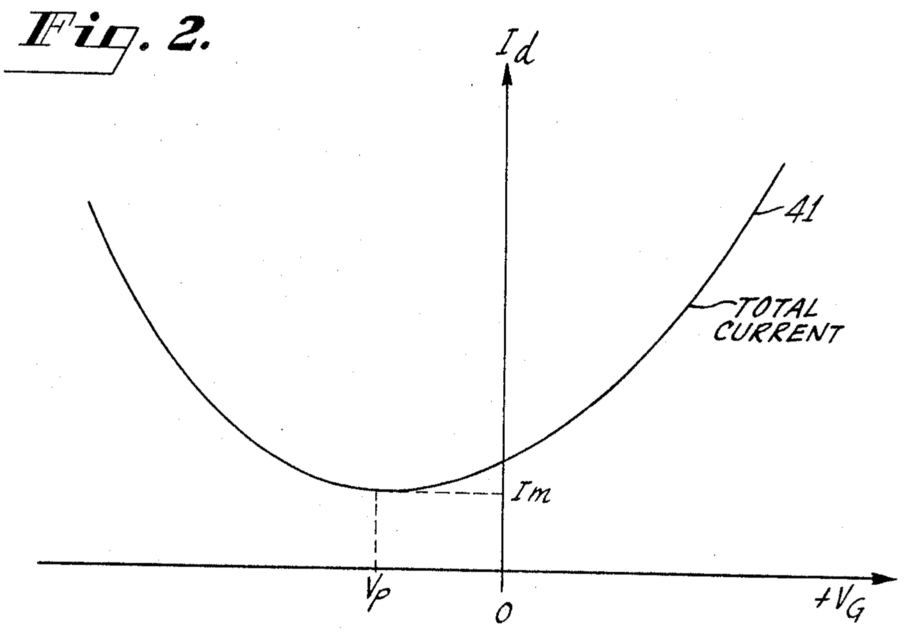
Figure 3:
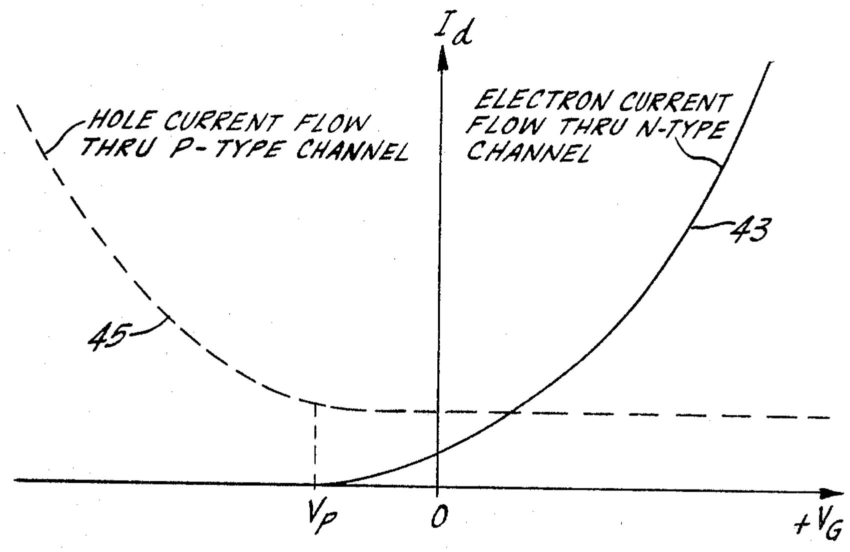

A more detailed description of the invention and illustrative embodiments thereof appear below in conjunction with the drawings in which:

FIGURE 1 is a sectional view of one embodiment of a field-effect transistor of the invention, FIGURE 2 is a curve illustrating the drain current versus gate voltage characteristic of the device of FIGURE 1, and FIGURE 3 is a set of curves derived from the curve of FIGURE 2, illustrating the individual drain current versus gate voltage characteristic through each channel of the device of FIGURE 1, FIGURE 4 is a partially-sectional perspective view of a second embodiment of the invention.

Similar reference numerals are used for similar elements throughout the drawings.

FIGURE 1 illustrates, in section a typical insulated-gate field-effect transistor 21 of the invention. The transistor 21 comprises a high resistivity base 23. The base 23 may be either single crystal or polycrystalline of any semiconductor or it may be an insulator material. Some examples of suitable base materials are intrinsic silicon, glass, alumina ceramic, and plastic such as a polyethylene terephthalate polymer. The base 23 supports the other structures (described below) of the device and is otherwise passive to the operation of the device. The base may be of any convenient length, width and thickness. Where the other structures are self-supporting, the base 23 may be omitted.

A first channel 25 of low resistivity semiconductor material of one conductivity type rests upon a surface of the base 23. A second channel 27 of low resistivity semiconductor material of the other conductivity type rests upon the first channel 25. The first and second channels 25 and 27 are of opposite conductivity types with respect to one another and define a P–N junction therebetween. The P-type channel may be either adjacent the base 23 or spaced from the base 23 by the N-type channel. As shown in FIGURE 1, solely for purposes of illustration, the N-type channel 27 is spaced from the base 23 by the P-type channel 25. The first and second channels 25 and 27 both may be single crystal or one may be single crystal and the other polycrystalline or both may be polycrystalline, and may be of any semiconductor material used to prepare transistors in the semiconductor art. Some examples of suitable channel materials are germanium, silicon, gallium arsenide, indium antimonide, and cadmium sulfide. The first and second channels 25 and 27 may be of the same or of different semiconductor materials.

A layer 29 of insulator material rests upon the second channel 27. The layer 29 may be of any insulator or high resistivity material known in the semiconductor art. Some suitable materials are silicon dioxide and organic polymer films. A gate electrode 31 rests upon the insulator layer 29. The gate electrode 31 is preferably of a metal, such as aluminum, gold or silver.

A source 33 connects to one end of channels 25 and 27. The source 33 provides a low resistivity contact to both channels 25 and 27. A drain 35 connects to the other end of both channels 25 and 27. The drain 35 also provides a low resistivity contact to both channels 25 and 27. A source electrode 37 connects to the source 33, and a drain electrode 39 connects to the drain 35. The source 33 and the drain 35 may be of a metal or of a low resistivity semiconductor material. The source electrode 37 and the drain electrode 39 each may be of metal and provide a low resistance contact to the source and drain respectively. In some cases, the source 33 and the source electrode 37 may be combined in a single structure. Also, in some cases, the drain 35 and the drain electrode 39 may be combined in a single structure.

As shown in FIGURE 1, the two channels 25 and 27 have substantially the same channel length, which is the distance between the source and the drain. However, the two channels may be of different lengths. Each channel length is not critical, however, the shorter the channel lengths, the higher the frequency response of the device. A convenient channel length is about 0.0001 to 0.010 inch. The gate electrode 31 is preferably the same effective length as the channels. The insulator layer 29 is at least as long as the gate electrode 31. Where the gate electrode 31 is shorter than the channel length, a parasitic resistance may be included in series with one or both of the channels. Where the gate electrode 31 is longer than the channels, an additional parasitic capacitance is introduced between the gate electrode 31 and the source 33, or the drain 35, or both.

The two channels 25 and 27 are preferably the same width but may be of different widths (width refers to the dimension normal to the paper in the view of FIGURE 1). The insulator layer 29 is preferably wider than the width of the channels. The gate electrode 31 also may be of any width but is preferably wider than the width of the channels and overlaps at both ends thereof. The two channels 25 and 27 are preferably as thin as possible, so that the device exhibits the lowest value of I*m* (described below). The thicknesses of the channels 25 and 27 and of the insulator layer 29 may be tailored to provide desired operating ranges of gate voltage, drain voltage, and drain current. Also an insulator layer (not shown) may be interposed between the channels 25 and 27 for the same purposes.

The device may be fabricated singly. Arrays of devices may be fabricated on a single support which may then be separated into single units, or may be wired together to form circuits. Arrays of the devices, already wired, with or without passive elements, may be fabricated directly on a single support.

FIGURE 1 also illustrates a circuit for operating the transistor 21. In the circuit, the source electrode 37 is connected to a ground 51 by a source lead 53. The gate electrode 31 is connected to a terminal of a supply 55 of gate voltage V*g* by a gate lead 57. The other terminal of the supply 55 of gate voltage is grounded. The drain electrode 39 is connected to a terminal of an adjustable supply 59 of drain voltage V*d* by a drain lead 61 through a load 63. The other terminal of the supply 59 of drain voltage is grounded. Output terminals 65 are connected to the ends of the load 63.

In one mode of operation, the drain voltage V*d* is adjusted to a desired value. A gate voltage V*g*, which is the input or signal to the transistor, and which may be D.C., A.C. in frequencies up to about 100 mc., or pulses, is provided from the gate voltage supply 55, or may be impressed in addition to a bias voltage. Drain current I*d*, which is the output of the transistor, flows from the drain voltage supply 59, through the drain lead 61 and the load 63 to the drain electrode 39, then from the drain electrode 39 through the drain 35, through one or both of the channels 25 and 27, the source 33, the source electrode 37 and then from the source electrode 37 to the ground 51 and returns to the drain supply 59. The drain current I*d* is a replica of the gate voltage V*g*. The output power may be many times the input power; and the input impedance may be many times the output impedance. Thus, the transistor may be used to translate from a higher impedance input to a lower impedance output, to amplify the input power, or both translate and to amplify.

FIGURE 2 is a typical static curve 41 illustrating the transfer characteristic (drain current I*d* plotted against gate voltage V*g*) of the transistor and circuit of FIGURE 1. The drain voltage V*d* is held constant at a given value in volts and the source electrode 37 is connected to ground. Increasing values of gate voltage V*g* in volts are applied to the gate and the corresponding drain current I*d* in milliamperes with a zero load are measured. Starting at V*g* equal to zero, the drain current increases with increasing positive gate voltage, with the drain current roughly proportional to the square of the gate voltage. With increasing negative gate voltage, the drain current decreases to a minimum I*m* at V*g* equal to V*p* (V*p* is the pinch-off voltage of the N-type channel), and then increases in a manner roughly proportioal to the square of the gate voltage. The gate input impedance is capacitive at low frequencies. The leakage resistance through the insulator layer 29 is estimated to be in the range of $10^{14}$ to $10^{16}$ ohms.

One explanation for the characteristic shown in FIGURE 2 is described as follows in connection with the curves of FIGURE 3. The curve 43 may be considered the electron current flow through the N-type channel. The dashed curve 45 may be considered the hole current flow through the P-type channel. With the gate voltage equal to zero, drain current flows from the source to the drain by electrons in the N-type channel and also by holes in the P-type channel. A positive gate voltage places additional electrons in the N-type channel and thereby increases the electron current in the N-type channel by the enhancement mode of field-effect operation as shown by the solid curve 43 in the first quadrant of FIGURE 3. Since these additional electrons accumulate near the interface with the insulator layer 29, the electric field produced by the positive gate voltage does not penetrate into the P-type layer and no change in hole current takes place, as shown by dashed curve 45 in the first quadrant of FIGURE 3. A negative gate voltage depletes electrons from the N-type layer and lowers the electron current in the N-type channel by the depletion mode of field-effect operation as shown by the solid curve 43 in the second quadrant of FIGURE 3. V*p* is the pinch-off voltage for the N-type channel and is the gate voltage needed to completely deplete the N-type layer of electrons. Once the N-type channel is depleted of electrons, the electric field from the gate electrode 31 penetrates the P-type channel and enhances the concentration of holes in the P-type channel. As a result, the hole current through the P-type channel increases with further increased negative gate voltage, as shown by the dashed curve 45 in the second quadrant of FIGURE 3. The total current through the device is the sum of both the hole current and electron current as illustrated by the curve 41 in FIGURE 2.

If the source and drain leads are reversed (so that the drain 35 is connected to the ground 51 and the source 33 is connected to the drain voltage supply 59), essentially the same curve as in FIGURE 2 is obtained, even though the direction of current flow through the channels is reversed. If the positions of the N-type channel and the P-type channels are reversed, then a similar curve is obtained except that the opposite polarities of gate voltage are required. Since the shape of the curve 41 is related to the concentration of free carriers in the two channels, the minimum current I*m*, the pinch-off voltage V*p*, and the shape of the curve can be controlled by changing the concentration of free carriers in the two channels, by altering the thickness of the insulator layer 29, and by interposing an insulator layer between the channels.

*Example 1*

One embodiment of a transistor of the invention similar to that illustrated in FIGURE 1. In this embodiment, the channels, the insulator layer 29 and the gate electrode 31 are prepared by depositing successive layers upon a substrate. In this example, an N-type channel is grown epitaxially upon a base of an intrinsic semiconductor. Then a P-type channel is grown epitaxially upon the N-type layer. Finally, the insulator layer and the gate electrode are each deposited in that order.

Start with a single crystal wafer 23 of high resistivity (typically 1000 ohm-cm.) silicon about 0.1 by 0.1 by 0.01 inch thick. Heat the wafer in a hydrogen atmosphere containing silicon tetrachloride and a small proportion of phosphorus trichloride at about 1025° C. for about 10 minutes. A thin layer 25 of N-type silicon about 0.2 micron thick deposits on the surface of the wafer. Then, heat the wafer in a hydrogen atmosphere containing silicon tetrachloride and a small proportion of boron trichloride. A thin layer 27 of P-type silicon about 0.2 micron thick deposits on the N-type layer 25 previously deposited. Next, vapor deposit layers about 2 microns thick, of antimony doped gold on those parts of the P-type layer which are to be converted into source 33 and drain 35. Heat the wafer 23 at about 450° C. for about 5 minutes to alloy the antimony doped gold into and through the layers 25 and 27 to a depth greater than 0.4 micron to form the source 33 and the source electrode 37, and the drain 35 and the drain electrode 39 and to define the channel length of the device. Next, evaporate a layer 29 of silicon monoxide upon the P-type layer 27 over the channel region to a thickness of about 1000 A. Finally, evaporate a layer 31 of aluminum metal on the silicon monoxide layer 29 opposite the channel 27.

*Example 2*

A second embodiment of a transistor of the invention is illustrated in FIGURE 4. In this embodiment the P-type channel is prepared by impurity-diffusion in an intrinsic semiconductor wafer; the N-type channel and the insulating layer are thermally grown on the impurity-diffused channel; and the source, drain, and gate electrodes are vapor deposited.

Start with a single crystal wafer 23*a* of high resistivity (typically 1000 ohm-cm.) silicon, about 0.2 by 0.2 by 0.01 inch thick. Diffuse a thin P-type channel into the intrinsic single crystal silicon 23*a*. This may be accomplished by depositing boron doped silicon dioxide on the substrate over a portion of the wafer, and then diffusing the boron into the silicon by heating the wafer at 1050° C. for 1 hour in a dry nitrogen atmosphere. This step forms the first channel 25*a*. Remove (as by chemical etching) the remaining doped silicon dioxide and oxidize the doped silicon surface by heating the wafer in dry oxygen at about 925° C. for about 4 hours. This oxidation step produces an outer layer of thermally grown silicon oxide 29*a* and partially converts the silicon under the thermally grown oxide 29*a*, which constitutes an N-type channel 27*a* (inversion layer) in the surface of the silicon. Using photo-resist techniques, apply a mask to the oxidized surface and chemically etch the exposed portions to selectively remove the thermally grown silicon dioxide and inversion layer over the source and drain regions. Vapor deposit through a mask antimony doped gold 42 and 44 in a layer about 0.5 micron thick on the N-type channel 27*a*. Alloy the deposited gold into the N-type channel 27*a* by heating the wafer at 450° C. for 5 minutes. Then, vapor deposit through a mask, aluminum metal 46 and 47 about 0.5 micron thick, overlapping the N and P-type layers as shown in FIGURE 4. Alloy the deposited aluminum at about 600° C. for about 5 minutes. Vapor deposit a metal gate electrode 31*a*, such as aluminum metal, on the thermally grown silicon dioxide layer 29*a* over the channel region.

What is claimed is:

1. A semiconductor device comprising a first channel of low resistivity semiconductor material of one conductivity type, a second channel of low resistivity semiconductor material of the opposite conductivity type upon said first channel, a layer of insulator material upon said second channel, a gate electrode upon said layer of insulator material, a common source providing low resistivity contact to both of said channels, and a common drain providing low resistivity contact to both of said channels.

2. A semiconductor device comprising an insulating support, a first channel of low resistivity semiconductor material of one conductivity type upon said support, a second channel of low resistivity semiconductor material of the opposite conductivity type upon said first channel, a layer of insulator material upon said second channel, a gate electrode upon said layer of insulator material, a common source providing low resistivity contact to both of said channels and a common drain providing low resistivity contact to both of said channels.

3. A field-effect transistor comprising a body of high resistivity semiconductor material, a first channel of low resistivity semiconductor material of one conductivity type upon said body, a second channel of low resistivity semiconductor material of the opposite conductivity type upon said first channel, a layer of insulator material upon said second channel, a gate electrode upon said insulator layer, a common source providing low resistivity contact to both of said channels, and a common drain providing low resistivity contact to both of said channels.

References Cited by the Examiner

UNITED STATES PATENTS

| | | | |
|---|---|---|---|
| 1,900,018 | 3/1933 | Lilienfeld | 317—235 |
| 2,756,285 | 7/1956 | Shockley | 317—235 |
| 2,900,531 | 8/1959 | Wallmark | 317—235 |
| 2,940,022 | 6/1960 | Pankove | 317—235 |
| 2,979,427 | 4/1961 | Shockley | 317—235 X |
| 3,191,061 | 6/1965 | Weimer | 317—235 |

FOREIGN PATENTS

| | | |
|---|---|---|
| 1,037,293 | 9/1953 | France. |

JOHN W. HUCKERT, *Primary Examiner.*

JAMES D. KALLAM, *Examiner.*

C. E. PUGH, J. R. SHEWMAKER, *Assistant Examiners.*